United States Patent
Tomita

(10) Patent No.: US 11,222,923 B2
(45) Date of Patent: Jan. 11, 2022

(54) RESISTANCE VARIABLE MEMORY

(71) Applicant: Winbond Electronics Corp., Taichung (TW)

(72) Inventor: Yasuhiro Tomita, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/666,421

(22) Filed: Oct. 29, 2019

(65) Prior Publication Data

US 2020/0227476 A1 Jul. 16, 2020

(51) Int. Cl.
*H01L 27/24* (2006.01)
*H01L 45/00* (2006.01)
*G11C 13/00* (2006.01)

(52) U.S. Cl.
CPC .......... *H01L 27/249* (2013.01); *G11C 13/004* (2013.01); *G11C 13/0026* (2013.01); *G11C 13/0028* (2013.01); *G11C 13/0038* (2013.01); *G11C 13/0069* (2013.01); *G11C 13/0097* (2013.01); *H01L 45/1206* (2013.01); *H01L 45/1253* (2013.01); *G11C 2013/0045* (2013.01); *G11C 2013/0078* (2013.01)

(58) Field of Classification Search
CPC ........................ G11C 13/0004; G11C 11/5678
USPC .......................................................... 365/148
See application file for complete search history.

(56) References Cited

U.S. PATENT DOCUMENTS

| 7,859,885 B2 | 12/2010 | Toda |
| 9,042,153 B2* | 5/2015 | Chung ............... G11C 13/0023 365/148 |
| 9,514,810 B1 | 12/2016 | Sadd et al. |
| 9,972,386 B2 | 5/2018 | Blomme et al. |
| 2012/0087169 A1 | 4/2012 | Kuo et al. |
| 2015/0070965 A1 | 3/2015 | Bandyopadhyay et al. |
| 2015/0070966 A1 | 3/2015 | Bandyopadhyay et al. |

(Continued)

FOREIGN PATENT DOCUMENTS

| CN | 106205681 | 12/2016 |
| CN | 108735262 | 11/2018 |

(Continued)

OTHER PUBLICATIONS

"Office Action of Japan Counterpart Application", dated Feb. 12, 2020, p. 1-p. 6.

(Continued)

*Primary Examiner* — Anthan Tran
(74) *Attorney, Agent, or Firm* — JCIPRNET

(57) ABSTRACT

The disclosure provides a resistance variable memory that can realize high integration. The resistance variable memory of the disclosure includes a plurality of transistors formed on a surface of a substrate, and a plurality of variable resistance elements stacked on the surface of the substrate in a vertical direction. One electrode of each of the variable resistance elements is commonly electrically connected to one electrode of one transistor, and another electrode of each of the variable resistance elements is respectively electrically connected to a bit line, and another electrode of each of the transistors is electrically connected to a source line, and each gate of transistors in a row direction is commonly connected to a word line.

20 Claims, 17 Drawing Sheets

(56) References Cited

U.S. PATENT DOCUMENTS

| | | | | |
|---|---|---|---|---|
| 2015/0357032 | A1* | 12/2015 | Tatsumura | G11C 11/1673 365/72 |
| 2016/0180929 | A1* | 6/2016 | Kang | H01L 27/2409 365/63 |
| 2016/0380030 | A1* | 12/2016 | Boivin | H01L 45/04 257/5 |

FOREIGN PATENT DOCUMENTS

| | | |
|---|---|---|
| JP | 2003249073 | 9/2003 |
| JP | 2005203463 | 7/2005 |
| JP | 2006127747 | 5/2006 |
| JP | 2008269741 | 11/2008 |
| JP | 2009224778 | 10/2009 |
| JP | 2010108595 | 5/2010 |
| JP | 4860787 | 1/2012 |
| JP | 5748877 | 7/2015 |
| JP | 2016134193 | 7/2016 |
| KR | 20050074328 | 7/2005 |
| KR | 100564637 | 3/2006 |
| TW | I415132 | 11/2013 |
| TW | I597833 | 9/2017 |
| WO | 2007023569 | 3/2007 |
| WO | 2011152061 | 12/2011 |

OTHER PUBLICATIONS

"Office Action of Japan Counterpart Application", dated Aug. 26, 2020, p. 1-p. 5.

Office Action of Taiwan Counterpart Application, dated Mar. 25, 2021, pp. 1-7.

Office Action of Korean Counterpart Application, with English translation thereof, dated Mar. 24, 2021, pp. 1-9.

"Office Action of China Counterpart Application", dated Sep. 10, 2021, p. 1-p. 18.

"Office Action of Korea Counterpart Application", dated Sep. 18, 2021, p. 1-p. 10.

\* cited by examiner

RESISTANCE VARIABLE MEMORY

CROSS-REFERENCE TO RELATED APPLICATION

This application claims the priority benefit of Japan application serial no. 2019-005316, filed on Jan. 16, 2019. The entirety of the above-mentioned patent application is hereby incorporated by reference herein and made a part of this specification.

BACKGROUND

Technical Field

The disclosure relates to a resistance variable memory using a variable resistance element, and more particularly to a three-dimensional structure of a memory array.

Description of Related Art

A resistance variable random access memory may randomly select a memory cell according to a column address and a row address, and read data from the selected memory cell or write data to the selected memory cell. A memory cell MC includes a variable resistance element and a transistor connected in series therewith. The gate of the transistor is electrically connected to the word line; the drain region is electrically connected to one electrode of the variable resistance element; the source region is electrically connected to the source line; and another electrode of the variable resistance element is electrically connected to the bit line. In general, writing a variable resistance element to a low resistance state is called set (SET), and writing it to a high resistance state is called reset (RESET).

A resistance variable memory includes a unipolar type and a bipolar type. In the unipolar type, the polarities of the write voltages applied to the variable resistance element at the time of set and reset are the same, and the set or reset is performed by changing the magnitude of the write voltage. On the other hand, in the bipolar type, the polarities of the write voltages applied to the variable resistance element at the time of set and reset are reversed. Further, in the case where a transition metal oxide such as hafnium oxide is used in the material of the variable resistance element, it is necessary to perform a forming operation on the transition metal oxide as an initial setting. The forming operation is to apply a voltage slightly larger than that when write is performed to the variable resistance element to a thin film so that the transition metal oxide film is converted from an insulating state to a variable resistance state (such as Japanese Patent No. 5748877).

In a bipolar resistance variable memory, it is necessary to dispose a bit line in a one-to-one relationship with a dedicated source line extending in the same direction as the bit line, with the ability to swap the symmetry of the bit line and the source line. However, such a layout may be a hindrance to high integration of a memory array.

Therefore, research has been conducted to realize high integration of a memory array in which source lines are shared by a plurality of memory cells. FIG. 1A illustrates a part of a memory array including shared bit lines, and FIG. 1B is a schematic cross-sectional diagram taken along a line X1-X1. As shown in FIG. 1A, shared bit lines S_BL1 and S_BL2 and word lines WL1 and WL2 extend in the same direction, and source lines SL1 and SL2 extend in a direction orthogonal thereto. The shared bit line S_BL1 is commonly connected to memory cells MC1 and MC3, and the shared bit line S_BL2 is commonly connected to memory cells MC2 and MC4. End portions of the shared bit line S_BL1 and the shared bit line S_BL2 are respectively connected to the bit line BL1 and the bit line BL2 (not shown), and the bit line BL1, the bit line BL2 and the source line SL extend in the same direction.

As shown in FIG. 1B, two transistors of the memory cells MC3 and MC4 are formed in a p-type well W on a silicon substrate. The gates of the two transistors are respectively connected to the word lines WL1 and WL2; the source regions share an n-type diffusion region; and the source regions are electrically connected to the source line SL2 via contacts CT11, vias V1, vias V2, and an intermediate metal IM1 and an intermediate metal IM2 of the substrate. The drain regions of the two transistors are respectively connected to corresponding variable resistance elements RE3 and RE4 via the contacts CT12 and the intermediate metal IM1 of the substrate, and the variable resistance element RE3 is connected to the shared bit line S_BL1 via the via hole contact V1. The drain region of the variable resistance element RE4 is also connected to the shared bit line S_BL2 in the same manner.

A memory array employing shared source lines can provide improved high integration, but it is still limited by the pitch of the transistors. Therefore, in order to realize further high integration, it is necessary to further reduce the transistor size, but the size reduction of the transistor is approaching a limit.

SUMMARY

The disclosure has been made to solve the above problems, and an object of the disclosure is to provide a resistance variable random access memory that can realize higher integration than conventional ones.

A resistance variable memory of the disclosure stores data in a reversible and non-volatile variable resistance element and includes: a plurality of transistors formed on a surface of a substrate; and a plurality of variable resistance elements stacked on the surface of the substrate in a vertical direction, one electrode of each of the plurality of variable resistance elements being commonly electrically connected to one electrode of one transistor, wherein another electrode of each of the plurality of variable resistance elements is electrically connected to a bit line, another electrode of each of the plurality of transistors is electrically connected to a source line, and each gate of transistors in a row direction is commonly connected to a word line.

According to the disclosure, a plurality of variable resistance elements are stacked on a surface of a substrate in a vertical direction, whereby high integration and high density of a memory array can be realized. Further, since a plurality of variable resistance elements share one transistor, compared with a memory cell formed by 1T×1R, high integration and high density of the memory array can be realized. In addition, by simultaneously integrating a diode and a variable resistance element, interference at the time of read or write and the sneak current issue can be more effectively suppressed.

DESCRIPTION OF THE EMBODIMENTS

Next, embodiments of the disclosure will be described in detail with reference to the drawings. In a preferred embodiment of the disclosure, a resistance variable memory has a memory array with a three-dimensional structure in which variable resistance elements are stacked in a vertical direction.

Figure 1A:
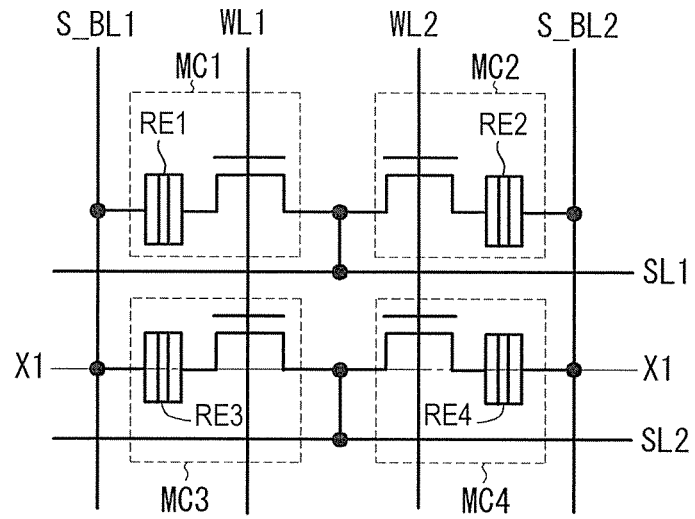
FIG. 1A is a circuit diagram of a part of a memory array including shared bit lines of a conventional resistance variable memory.
Figure 1B:
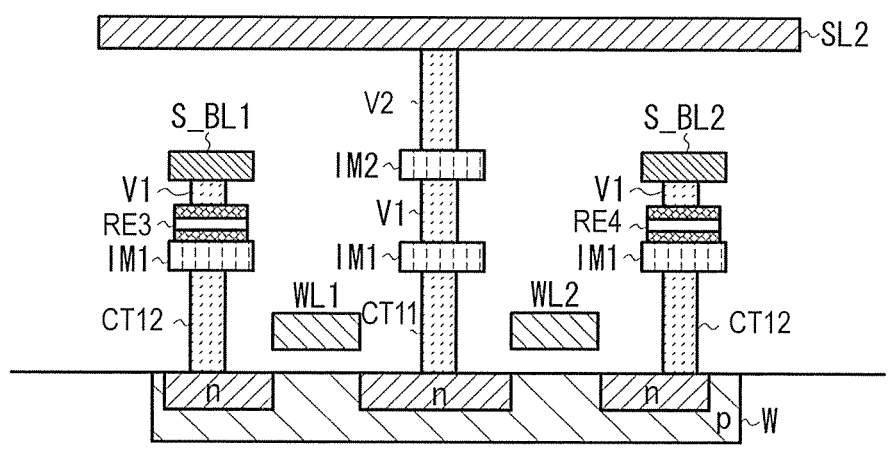
FIG. 1B is a schematic cross-sectional diagram taken along the line X1-X1 in FIG. 1A.
Figure 2:
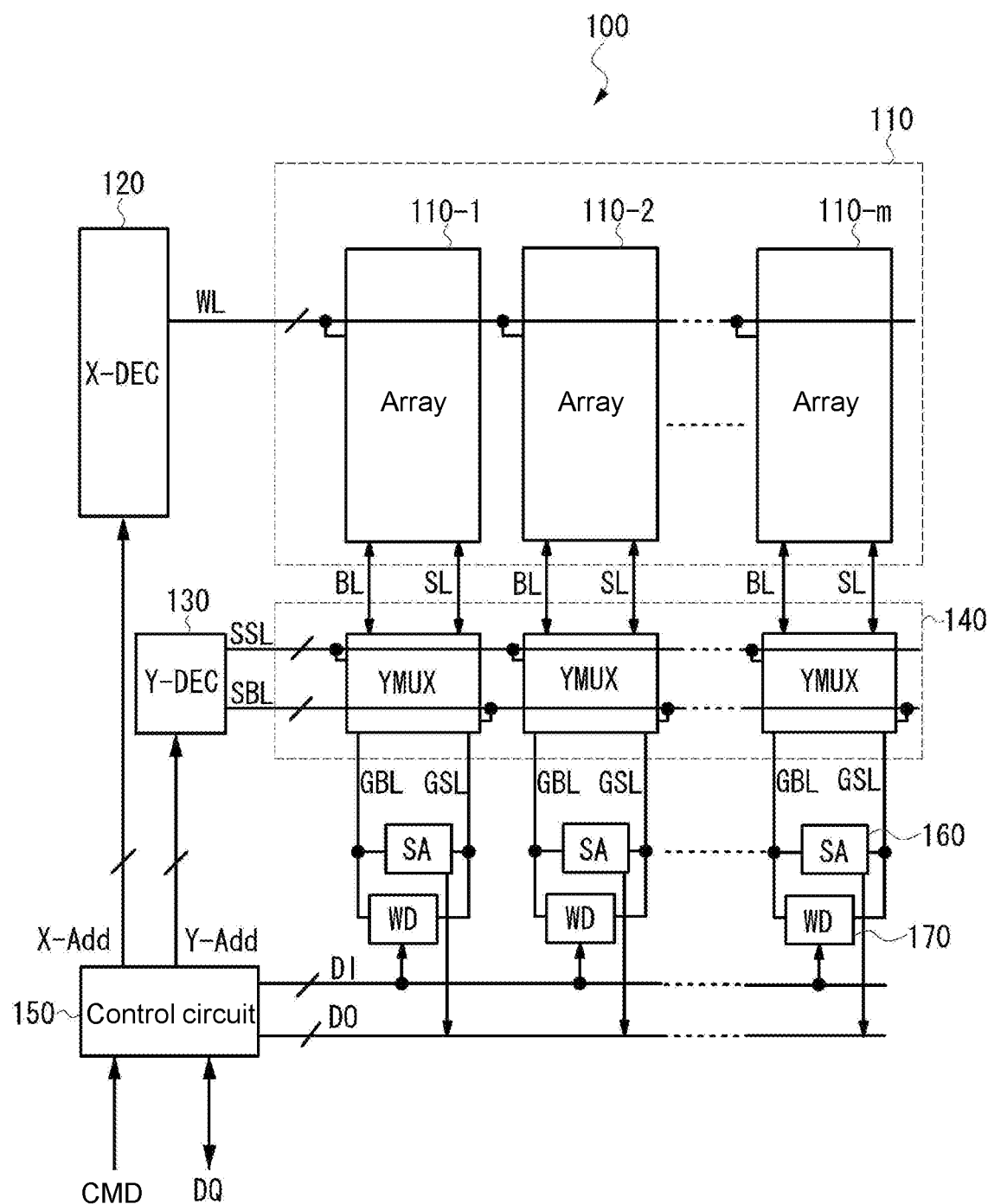
FIG. 2 is a block diagram showing a schematic configuration of a resistance variable random access memory according to an embodiment of the disclosure.

FIG. 2 is a block diagram showing a schematic configuration of a resistance variable random access memory according to an embodiment of the disclosure. A resistance variable memory 100 of the embodiment includes: a memory array 110 in which a plurality of memory cells including variable resistance elements and transistors are arranged in a matrix; a column decoder and driver circuit 120 which selects and drives word lines WL based on a column address X-Add; a row decoder and driver circuit 130 which generates a selection signal SSL/SBL for selecting global bit lines GBL and global source lines GSL based on a row address Y-Add; a row selection circuit 140 which respectively selects a connection between the global bit lines GBL and the bit lines BL and a connection between the global source lines GSL and the source lines SL based on the selection signal SSL/SBL; a control circuit 150 which controls each part based on a command CMD and data DQ received from the outside; sense amplifiers 160 which read read data of the memory cells via the GBL/BL; and write driver and read bias circuits 170 which apply a bias voltage at the time of a read operation or a voltage corresponding to set and reset at the time of a write operation via the GBL/BL.

The memory array 110 includes an m number of sub-arrays 110-1 to 110-m which are respectively and correspondingly connected to an m number of row selectors YMUX of the row selection circuit 140. The m number of row selectors YMUX are connected to the sense amplifiers 160 and the write driver and read bias circuits 170, respectively. Each of the sense amplifiers 160 is connected to the control circuit 150 via an internal data bus DO, and results read by the sense amplifiers 160 are output to the control circuit 150 via the internal data bus DO. Further, each of the write driver and read bias circuits 170 is connected to the control circuit 150 via an internal data bus DI, and each of the write driver and read bias circuits 170 receives the write data via the internal data bus DI.

Figure 3A:
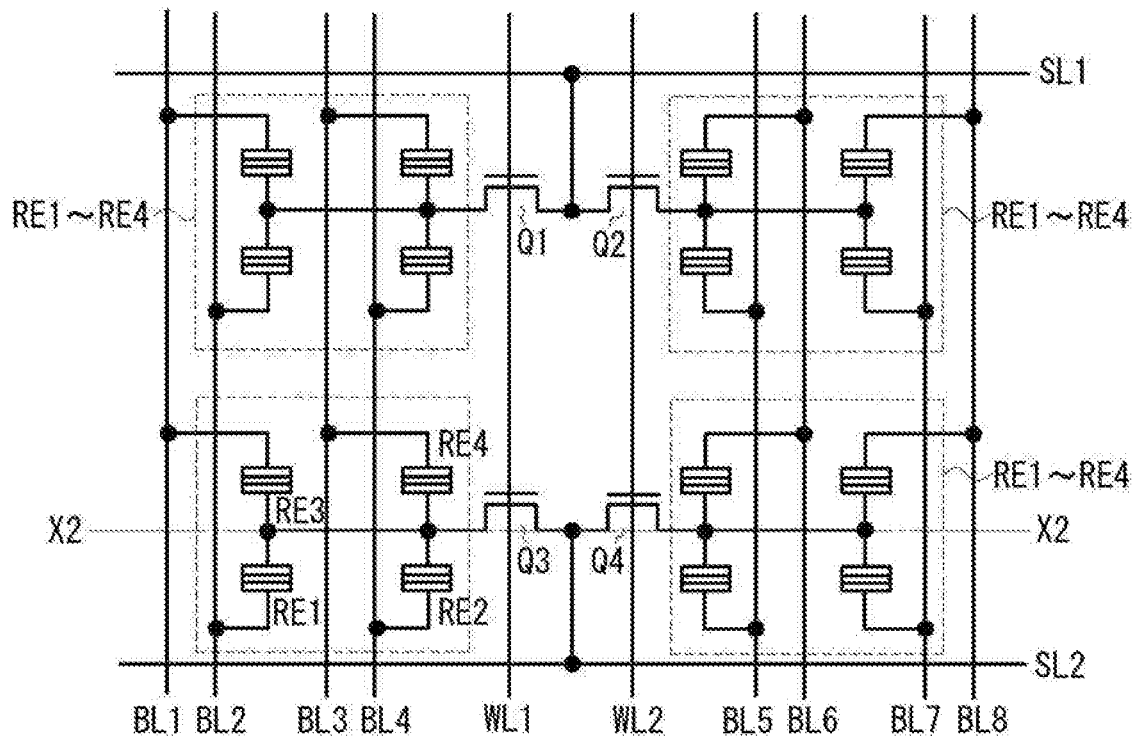
FIG. 3A is a circuit diagram of a part of a vertically stacked memory array according to the first embodiment of the disclosure.
Figure 3B:
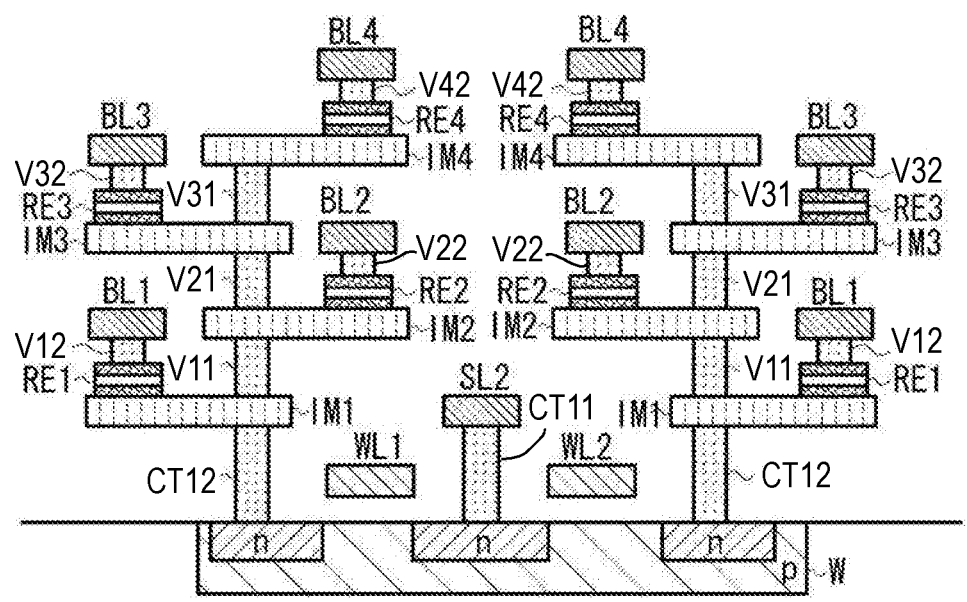
FIG. 3B is a schematic cross-sectional diagram taken along the line X2-X2 in FIG. 3A.

Next, a three-dimensional array structure of the resistance variable memory according to the first embodiment of the disclosure will be described. FIG. 3A is a circuit diagram of a part of a memory array with a three-dimensional structure of the embodiment, and FIG. 3B is a schematic cross-sectional diagram taken along the line X2-X2 in FIG. 3A.

As shown in FIG. 3A, word lines WL1 to WL2 and bit lines BL1 to BL8 extend in parallel with one another, and source lines SL1 to SL2 extend in a direction orthogonal thereto. The word line WL1 is connected to gates of transistors Q1 and Q3, and the word line WL2 is connected to gates of transistors Q2 and Q4. In the embodiment, four variable resistance elements are commonly connected to one transistor. One electrode of each of the variable resistance elements RE1 to RE4 connected to the transistor Q1 is commonly connected to one electrode of the transistor Q1, and another electrode of each of the variable resistance elements RE1 to RE4 is connected to the bit lines BL1 to BL4, respectively. The four variable resistance elements connected to the transistor Q3 are also configured in the same manner.

Similar to the dispositions of the transistor Q1 and the variable resistance elements RE1 to RE4 connected to the transistor Q1, one electrode of each of the four variable resistance elements connected to the transistor Q2 is commonly connected to one electrode of the transistor Q2, and another electrode of each of the four variable resistance elements connected to the transistor Q2 is connected to the bit lines BL5 to BL8, respectively. The four variable resistance elements connected to the transistor Q4 are also configured in the same manner. Moreover, another electrode of the transistor Q1 and another electrode of the transistor Q2 are commonly connected, and the connection node thereof is connected to the source line SL1; another electrode of the transistor Q3 and another electrode of the transistor Q4 are commonly connected, and the connection node thereof is connected to the source line SL2.

The memory array structure of the disclosure is configured, for example, by using a multilayer wiring structure on a silicon substrate. As shown in FIG. 3B, n-type diffusion regions for serving as source/drain electrodes of the transistors are formed in a P-type well W on the silicon substrate. The word lines WL1 to WL2 connected to the gates of the transistors are formed, for example, by a polysilicon layer. The four variable resistance elements commonly connected to one transistor are stacked on the silicon substrate in the vertical direction by using five layers of metal wiring.

An interlayer insulating film is formed on the polysilicon layer forming the word lines WL1 to WL2, and a first-layer metal wiring is formed thereon. The first-layer metal wiring forms the source line SL2 and an intermediate metal IM1, and a shared n-type diffusion region of the transistors Q3 and Q4 is electrically connected to the source line SL2 via a contact CT11 for the substrate formed on the interlayer insulating film. Further, another n-type diffusion region of each of the transistors Q3 and Q4 is electrically connected to the corresponding intermediate metal IM1 via a contact CT12 for the substrate formed on the interlayer insulating film.

An interlayer insulating film is formed on the first-layer metal wiring, and a second-layer metal wiring is formed on the interlayer insulating film. The second-layer metal wiring forms the bit line BL1 and an intermediate metal IM2. It should be noted here that the intermediate metal IM2 has the same shape as the intermediate metal IM1 and is formed at a position above the intermediate metal IM1 and partially shifting away therefrom, and the bit line BL1 is formed on the intermediate metal IM1. A contact V11 is formed in the interlayer insulating film between the intermediate metal IM1 and the intermediate metal IM2. The variable resistance element RE1 and a contact V12 are formed in the interlayer insulating film between the intermediate metal IM1 and the bit line BL1. The variable resistance element includes, for example, a transition metal oxide (TMO), such as hafnium oxide.

An interlayer insulating film is formed on the second-layer metal wiring, and a third-layer metal wiring is formed on the interlayer insulating film. The third-layer metal wiring forms the bit line BL2 and an intermediate metal IM3, and the intermediate metal IM3 has the same shape as the intermediate metal IM1 and is formed at a corresponding position above the intermediate metal IM1, and the bit line BL2 is formed on the intermediate metal IM2. A contact V21 is formed in the interlayer insulating film between the intermediate metal IM1 and the intermediate metal IM2. The variable resistance element RE2 and a contact V22 are formed in the interlayer insulating film between the intermediate metal IM2 and the bit line BL2.

Thereafter, similarly, a fourth-layer metal wiring forms the bit line BL3 and an intermediate metal IM4, and a fifth-layer metal wiring forms the bit line BL4. Thus, for one transistor, the four variable resistance elements RE1 to RE4 stacked in the vertical direction from the surface of the semiconductor substrate are formed. For example, when read of the variable resistance element RE3 is performed, the transistor Q3 is turned on via the word line WL1, and a read voltage is applied to the bit line BL3, and GND is applied to the source line SL2. When the variable resistance element RE3 is in a high resistance state, a small current flows from the bit line BL3 to the source line SL2, and if the variable resistance element RE3 is in a low resistance state, a large current flows from the bit line BL3 to the source line SL2. The detailed operations of read or write will be described later.

According to the embodiment, a plurality of variable resistance elements can be stacked on the surface of the semiconductor substrate in the vertical direction, and the plurality of stacked variable resistance elements share one transistor, so high integration and high density of the memory array can be realized.

Further, in the above embodiment, an example in which four variable resistance elements are commonly connected to one transistor is shown, but the disclosure is not limited thereto; for example, two or three variable resistance elements may be commonly connected to one transistor, or five or more variable resistance elements may be commonly connected. At this time, the number of stacked metal wirings also changes depending on the number of stacked variable resistance elements.

Figure 4:
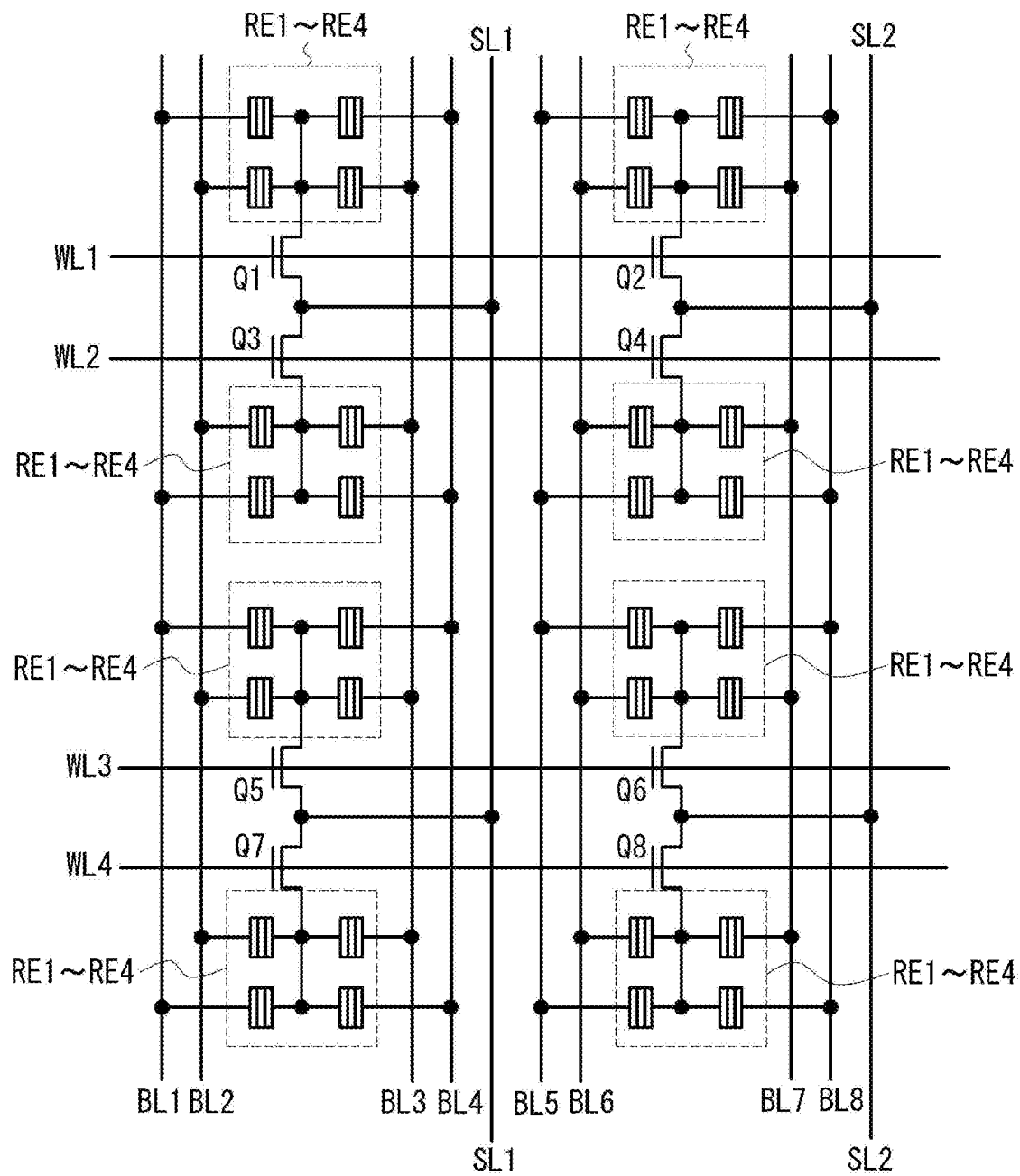
FIG. 4 is a circuit diagram of a part of a vertically stacked memory array according to the second embodiment of the disclosure.

Next, a configuration of a memory array according to a second embodiment of the disclosure will be described. FIG. 4 shows the configuration of the memory array of the second embodiment, and here, eight transistors and 32 variable resistance elements connected thereto are shown. This embodiment is different from the first embodiment in that the bit lines are parallel to the source lines, and the word lines extend in a direction orthogonal thereto. In such a configuration, since the bit lines are parallel to the source lines, the layout is easier than in the first embodiment. In the second embodiment, four variable resistance elements are also connected to one transistor, and the four variable resistance elements are stacked in the vertical direction from the surface of the semiconductor substrate by five layers of metal wirings.

Figure 5:
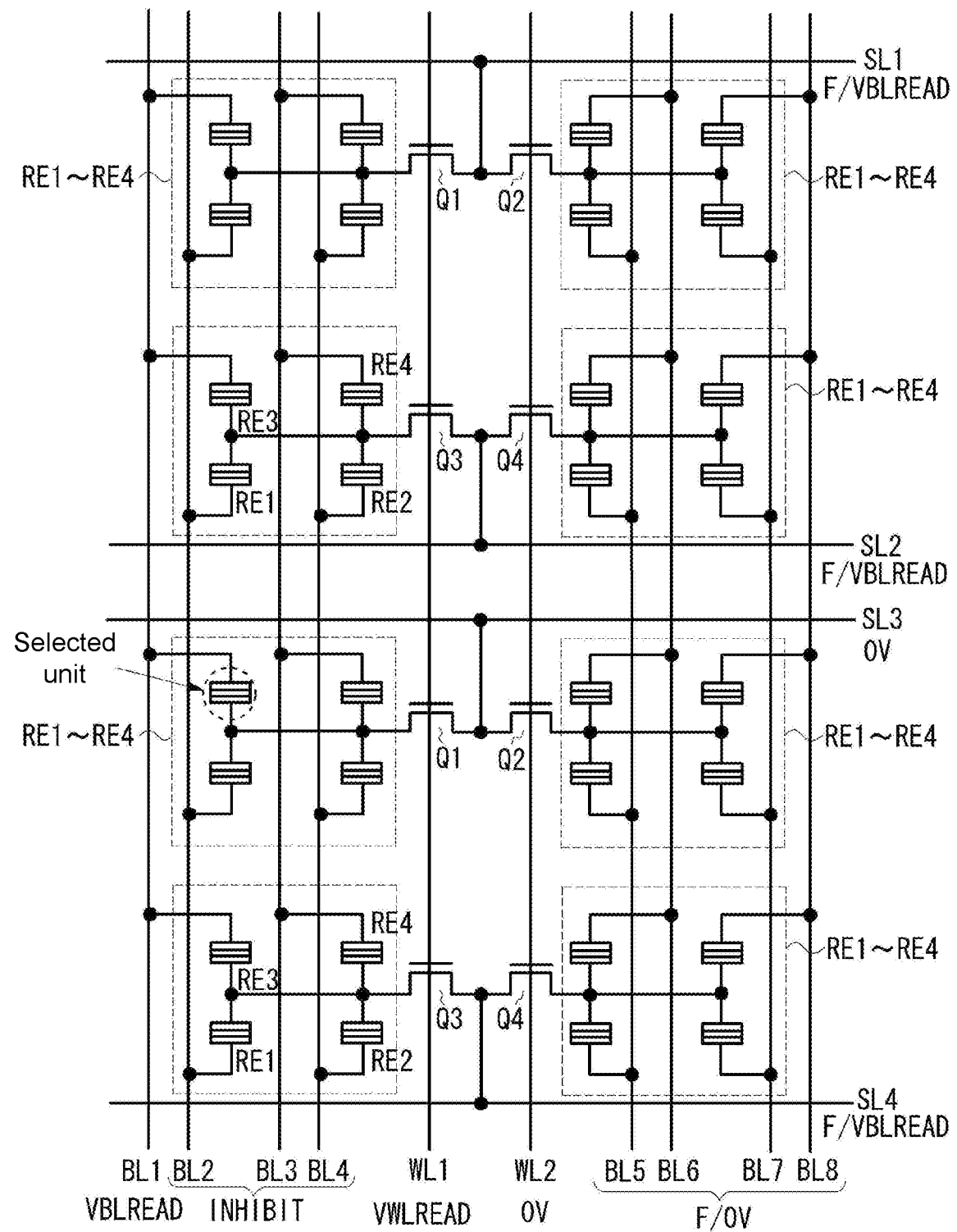
FIG. 5 is a diagram showing a bias voltage at the time of a read operation from the bit line side of the resistance variable memory according to the first embodiment of the disclosure.

Next, the operation of the memory array configuration of the first embodiment will be described. FIG. 5 shows a bias voltage when read is performed from the bit line side in the memory array of the first embodiment. A read voltage VWLREAD is applied to the selected word line WL1 so that the transistor connected to the selected word line WL1 is turned on. 0 V is applied to the unselected word line WL2 so that the transistor connected to the unselected word line WL2 is turned off. A read voltage VBLREAD is applied to the bit line BL1 of the selected variable resistance element connected to the selected transistor, and an inhibit voltage INHIBIT is applied to the bit lines BL2 to BL4 of other unselected variable resistance elements commonly connected to the selected transistor. In the case of performing integration on a diode, the inhibit voltage INHIBIT is applied via the diode to suppress a sneak current. 0 V is applied to the selected source line SL3. The bit lines BL5 to BL8 of the unselected variable resistance elements connected to the unselected transistor are applied with 0 V or are set to a floating state F, and the unselected source lines SL1 to SL2 and SL4 are set to the floating state F or are applied with the read voltage VBLREAD.

Here, the inhibit voltage INHIBIT applied to the bit lines BL2 to BL4 of the remaining three unselected variable resistance elements connected to the selected transistor is an intermediate voltage lower than the read voltage VBLREAD and higher than 0 V applied to the source lines. Thereby, the bias voltage required for reading is not applied to the unselected three variable resistance elements from the unselected bit lines BL2 to BL4. Further, when the selected variable resistance element is in a low resistance state, a large bias voltage is applied from the selected variable resistance element to the unselected variable resistance elements, or when the unselected variable resistance elements are in a low resistance state, it is ensured that the current does not flow into them.

In this manner, the read voltage VBLREAD is applied to the selected variable resistance element from the bit line side, and the sense amplifier 160 reads out a voltage or current corresponding to the high resistance state or the low resistance state of the selected variable resistance element.

Figure 6:
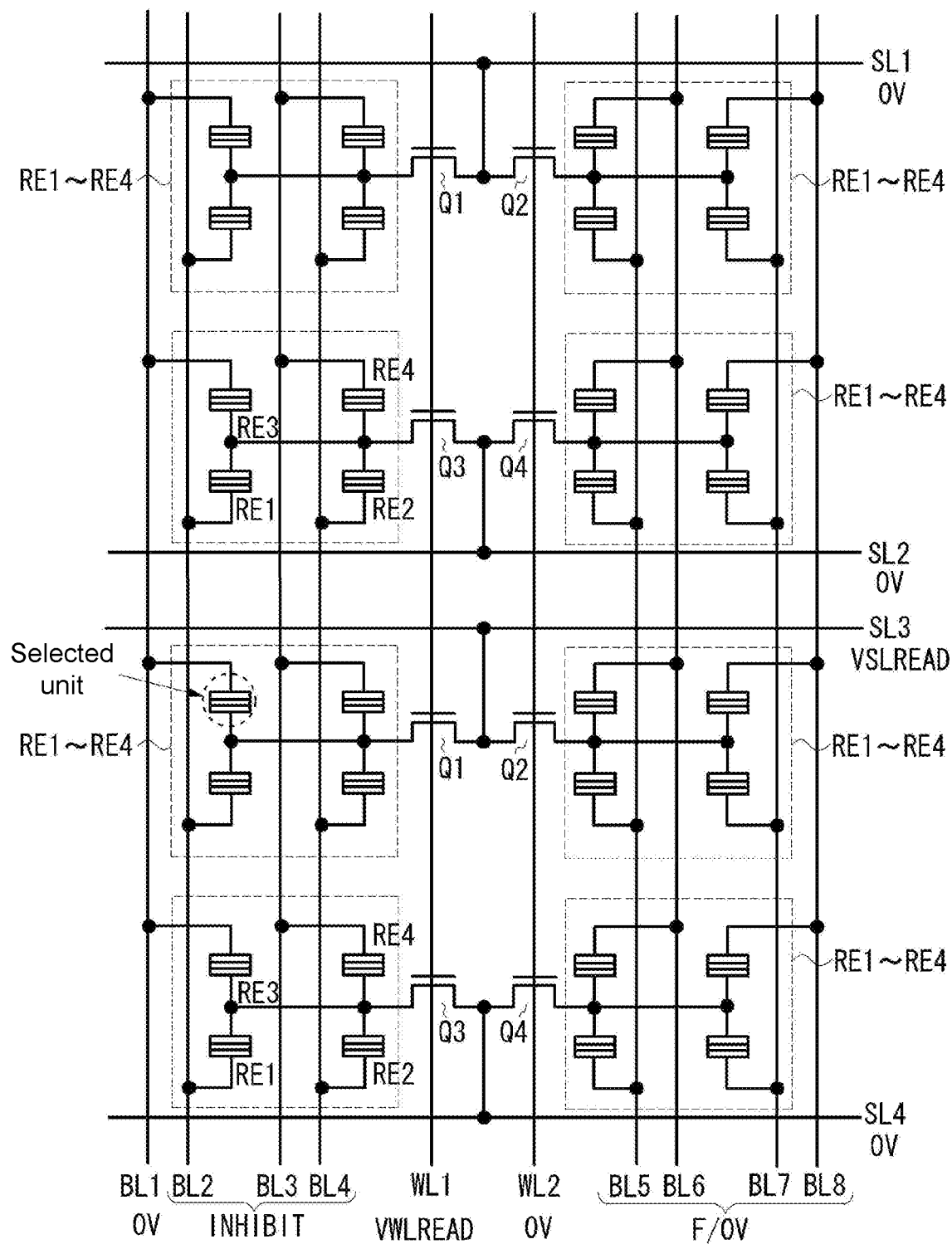
FIG. 6 is a diagram showing a bias voltage at the time of a read operation from the source line side of the resistance variable memory according to the first embodiment of the disclosure.

FIG. 6 shows a bias voltage when read is performed from the source line side in the memory array of the first embodiment. The read voltage VWLREAD is applied to the selected word line WL1, and 0 V is applied to the unselected word line WL2. 0 V is applied to the bit line BL1 of the selected variable resistance element connected to the selected transistor, and an inhibit voltage INHIBIT is applied to the bit lines BL2 to BL4 of other unselected variable resistance elements commonly connected to the selected transistor. In the case of performing integration on the diode, the inhibit voltage INHIBIT is applied via the diode to suppress a sneak current. A read voltage VSLREAD is applied to the selected source line SL3. The bit lines BL5 to BL8 of the unselected variable resistance elements connected to the unselected transistor are applied with 0 V or are set to the floating state F, and the unselected source lines SL1 to SL2 and SL4 are applied with 0 V.

In this manner, the sense amplifier 160 reads out a voltage or current corresponding to the high resistance state or the low resistance state of the selected variable resistance element.

Figure 7:
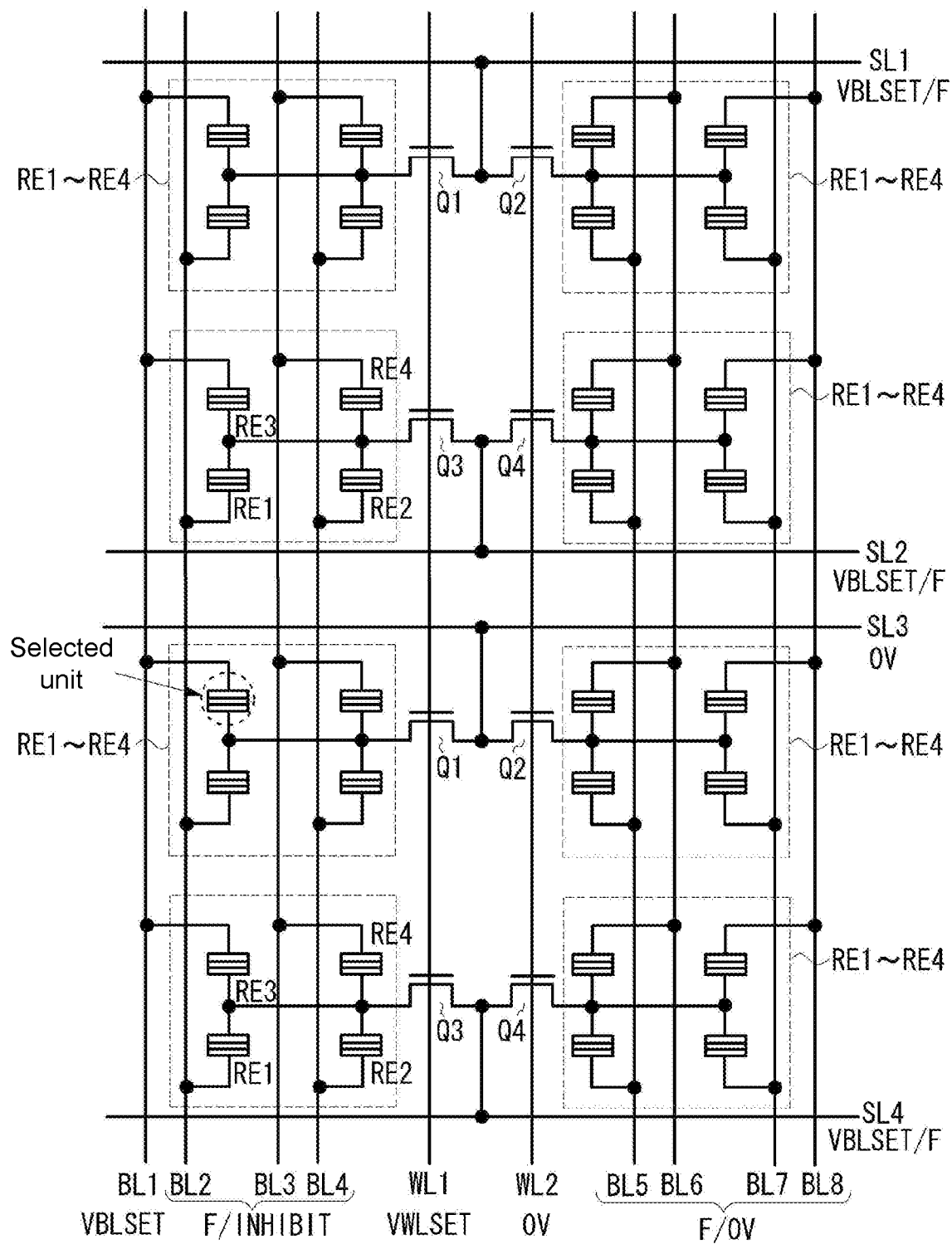
FIG. 7 is a diagram showing a bias voltage at the time of a SET write operation of the resistance variable memory according to the first embodiment of the disclosure.

Next, the bias voltage at the time of performing SET write in the memory array of the first embodiment is shown in FIG. 7. A write voltage VWLSET is applied to the selected word line WL1 so that the transistor connected to the selected word line WL1 is turned on. 0 V is applied to the unselected word line WL2 so that the transistor connected to the unselected word line WL2 is turned off. A write voltage VBLSET is applied to the bit line BL1 of the selected variable resistance element connected to the selected transistor, and the bit lines BL2 to BL4 of other unselected variable resistance elements commonly connected to the selected transistor are set to the floating state F or are applied with the inhibit voltage INHIBIT. 0 V is applied to the selected source line SL3. The bit lines BL5 to BL8 of the unselected variable resistance elements connected to the unselected transistor are set to the floating state F or are applied with 0 V, and the unselected source lines SL1 to SL2 and SL4 are applied with the write voltage VBLSET or are set to the floating state F.

In the embodiment, the bit lines BL2 to BL4 of the unselected variable resistance elements commonly connected to the selected transistor are set to the floating state F or are applied with the inhibit voltage INHIBIT, whereby the unselected variable resistance elements are not applied with a SET write bias voltage, and only the selected variable resistance element is applied with the SET write bias voltage, and the selected variable resistance element becomes the low resistance state. At the same time, since the inhibit voltage INHIBIT is an intermediate voltage lower than the write voltage VBLSET and higher than 0 V, it is possible to suppress the unselected variable resistance elements from being affected by the application of the SET write bias voltage.

Figure 8:
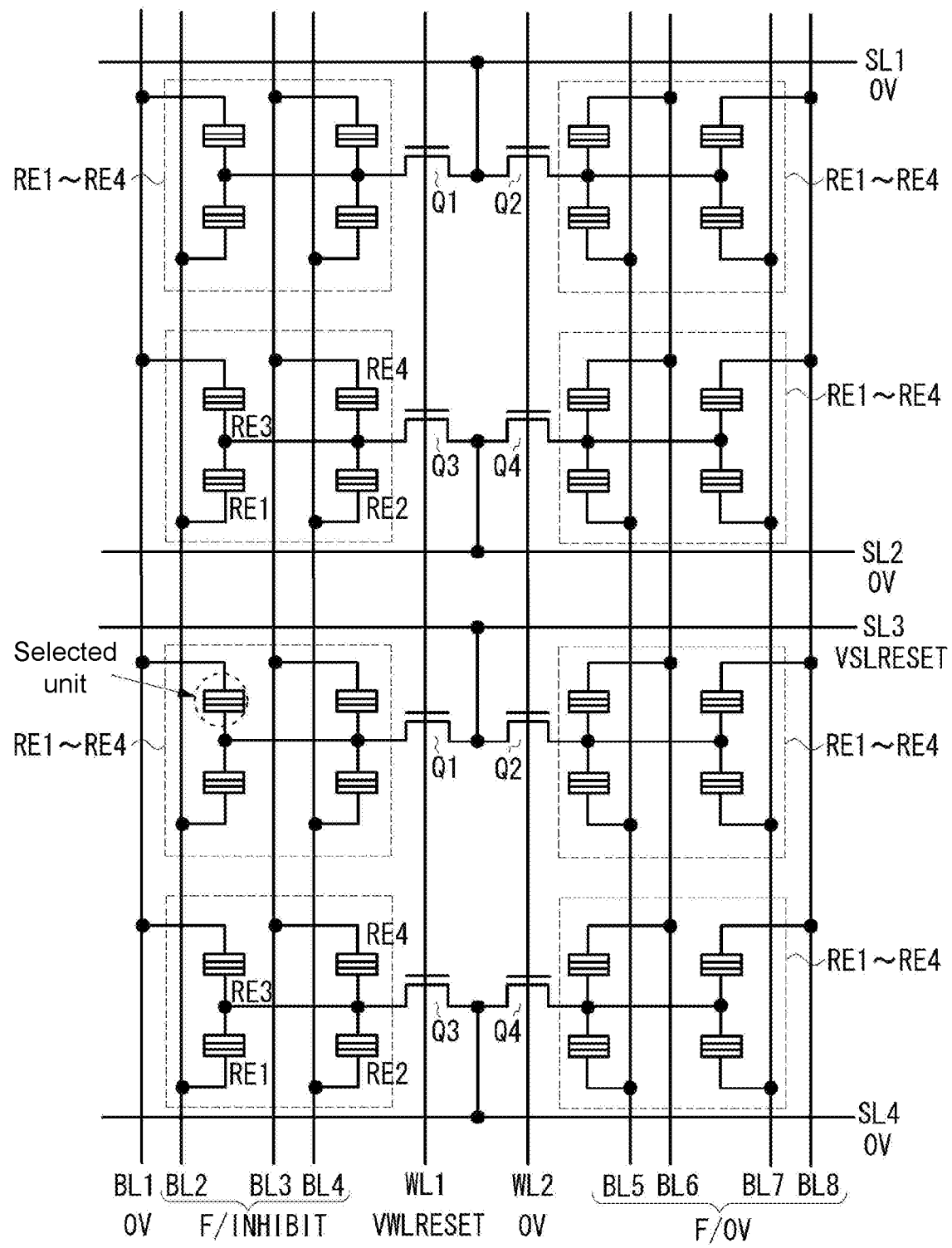
FIG. 8 is a diagram showing a bias voltage at the time of a RESET write operation of the resistance variable memory according to the first embodiment of the disclosure.

Next, the bias voltage at the time of performing RESET write in the memory array of the first embodiment is shown in FIG. 8. A write voltage VWLRESET is applied to the selected word line WL1 so that the transistor connected to the selected word line WL1 is turned on. 0 V is applied to the unselected word line WL2 so that the transistor connected to the unselected word line WL2 is turned off. 0 V is applied to the bit line BL1 of the selected variable resistance element connected to the selected transistor, and the bit lines BL2 to BL4 of other unselected variable resistance elements commonly connected to the selected transistor are set to the floating state F or are applied with the inhibit voltage INHIBIT. A write voltage VSLRESET is applied to the selected source line SL3. The bit lines BL5 to BL8 of the unselected variable resistance elements connected to the unselected transistor are set to the floating state F or are applied with 0 V, and the unselected source lines SL1 to SL2 and SL4 are applied with 0 V.

In the embodiment, the bit lines BL2 to BL4 of the unselected variable resistance elements commonly connected to the selected transistor are set to the floating state F or are applied with the inhibit voltage INHIBIT, whereby the unselected variable resistance elements are not applied with a RESET write bias voltage, and only the selected variable resistance element is applied with the RESET write bias voltage, and the selected variable resistance element becomes the high resistance state. At the same time, since the inhibit voltage INHIBIT is an intermediate voltage lower than the write voltage VSLRESET and higher than 0 V, it is possible to suppress the unselected variable resistance elements from being affected by the application of the RESET write bias voltage.

In the first embodiment, in order to prevent interference with other unselected variable resistance elements commonly connected to the selected transistor, the inhibit voltage INHIBIT is applied to the unselected bit lines, but with the high integration development of the memory array, the bias voltage control may not be sufficient to prevent interference. Therefore, in another embodiment, a diode SEL can be integrated with all of the variable resistance elements to prevent an undesired current from flowing to the unselected variable resistance elements.

Figure 9A:
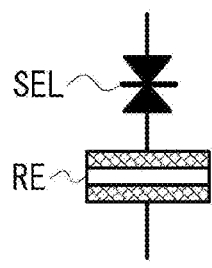
FIG. 9A shows an example of a diode integrated to a variable resistance element of a resistance variable memory according to a preferred embodiment of the disclosure.

As shown in FIG. 9A, the diode SEL is, for example, simultaneously formed when a variable resistance element RE is formed in a via hole formed in a lower electrode of the interlayer insulating film. In detail, a first electrode of the variable resistance element RE, a transition metal oxide of the variable resistance element RE, a second electrode of the variable resistance element RE, the diode SEL, and a metal plug may be sequentially formed in the via hole, wherein the diode SEL includes, for example, a stack of a p-type semiconductor layer and an n-type semiconductor layer. In this manner, the bit line and the intermediate metal are electrically connected via the variable resistance element RE, the diode SEL, and the metal plug in the via hole. In an embodiment, the diode SEL may also be formed on both sides of the second electrode of the variable resistance element or formed on both sides of the first electrode and the second electrode.

Figure 9B:
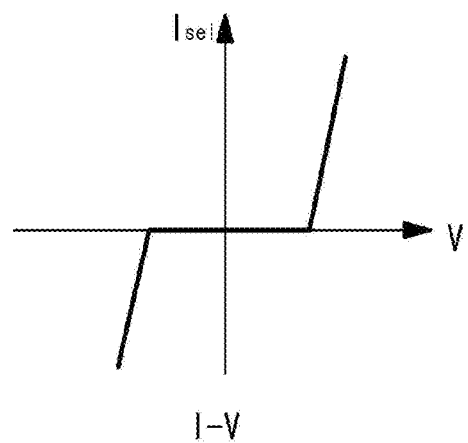
FIG. 9B is a graph showing a current-voltage (I-V) characteristic of the diode.

FIG. 9B is a graph showing an I-V characteristic of the diode SEL. As shown in the figure, the diode SEL has a characteristic of flowing a forward current when a forward bias voltage is greater than a threshold, and flowing a reverse current when a reverse bias voltage is greater than a threshold. Therefore, by applying an inhibit voltage, which is lower than the threshold voltage that causes the diode SEL to flow the forward/reverse current, to the bit lines of the unselected variable resistance elements, interference or the sneak current at the time of read or write can be more effectively suppressed.

Figure 10:
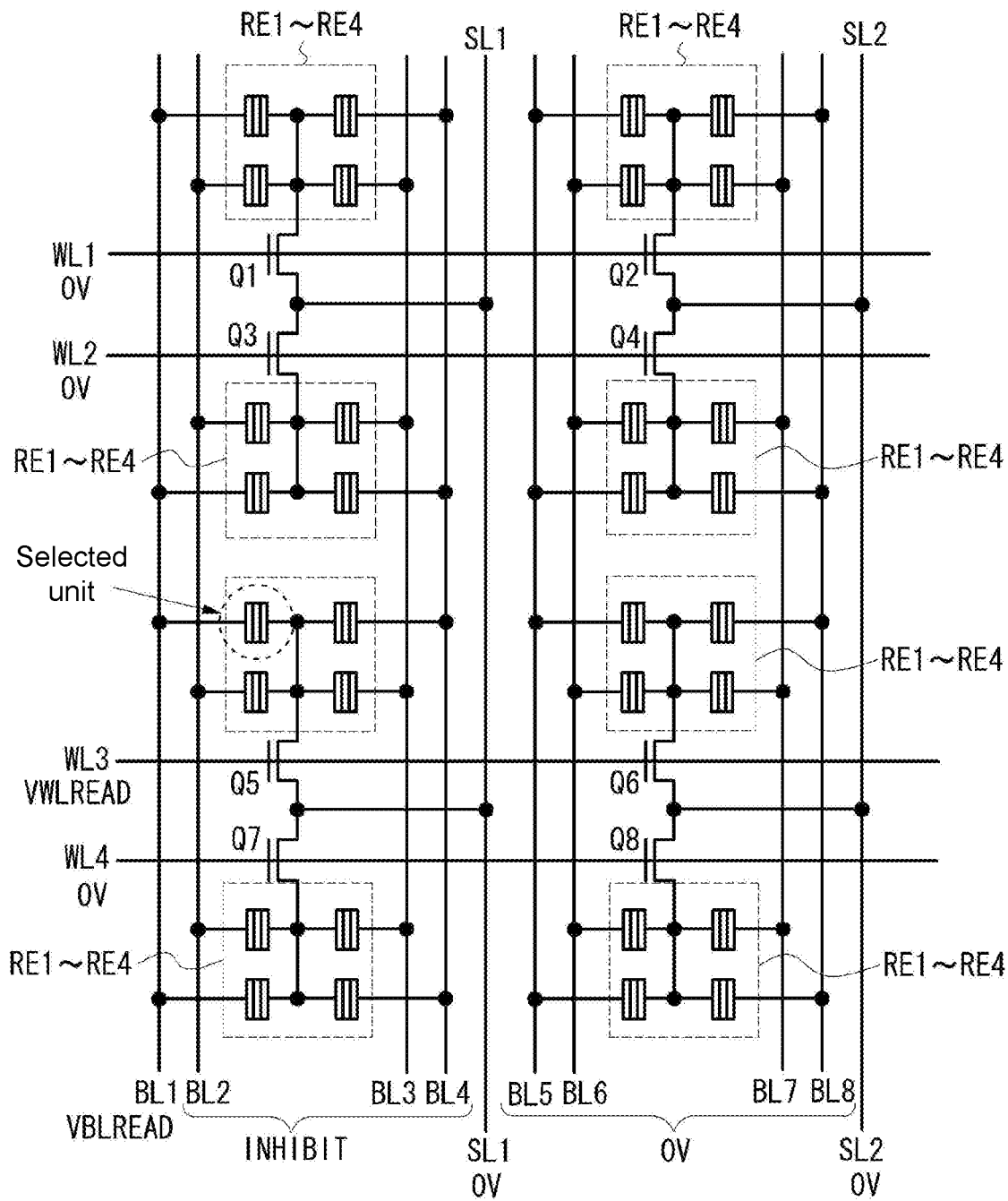
FIG. 10 is a diagram showing a bias voltage at the time of a read operation from the bit line side of the resistance variable memory according to the second embodiment of the disclosure.
Figure 11:
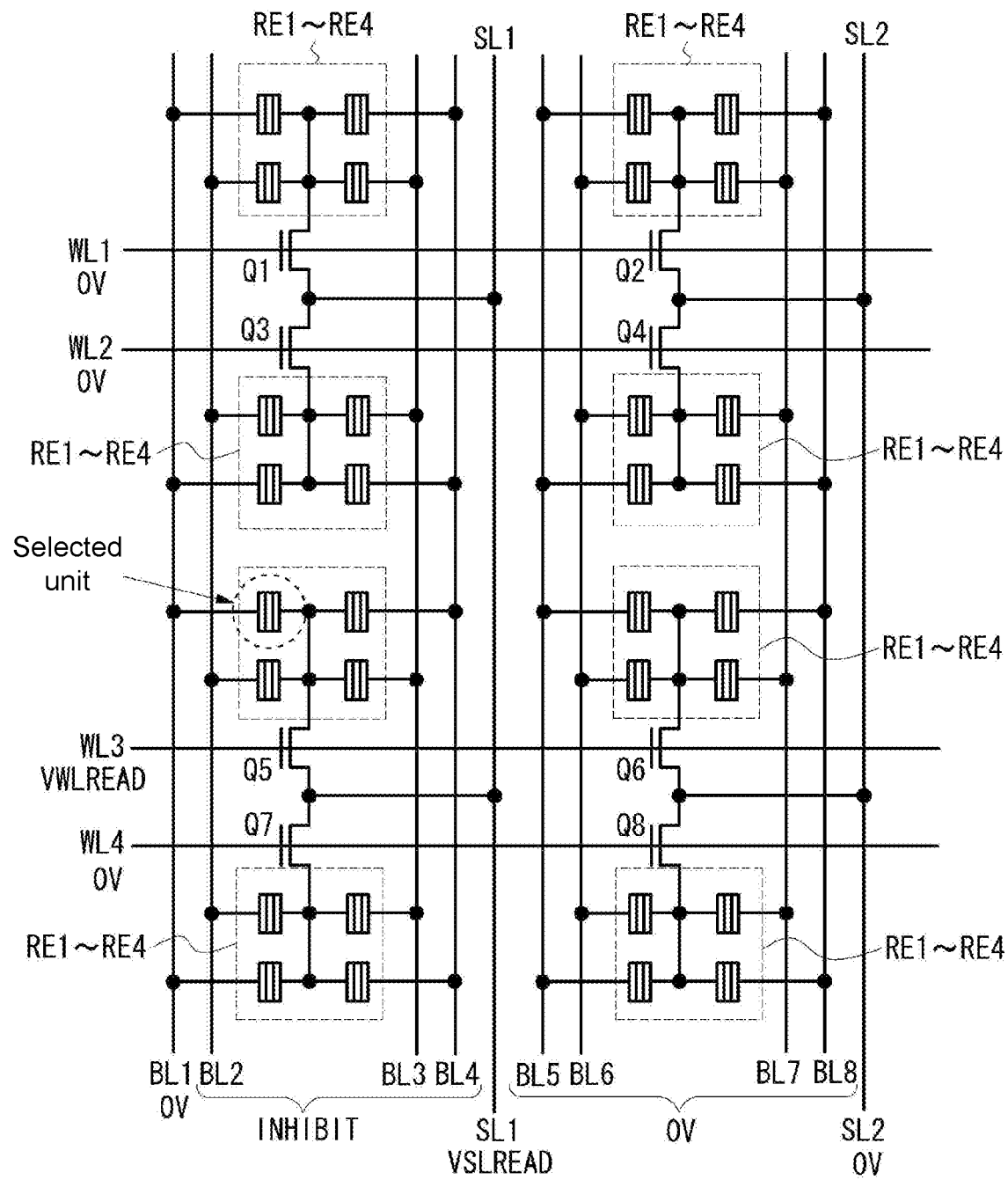
FIG. 11 is a diagram showing a bias voltage at the time of a read operation from the source line side of the resistance variable memory according to the second embodiment of the disclosure.
Figure 12:
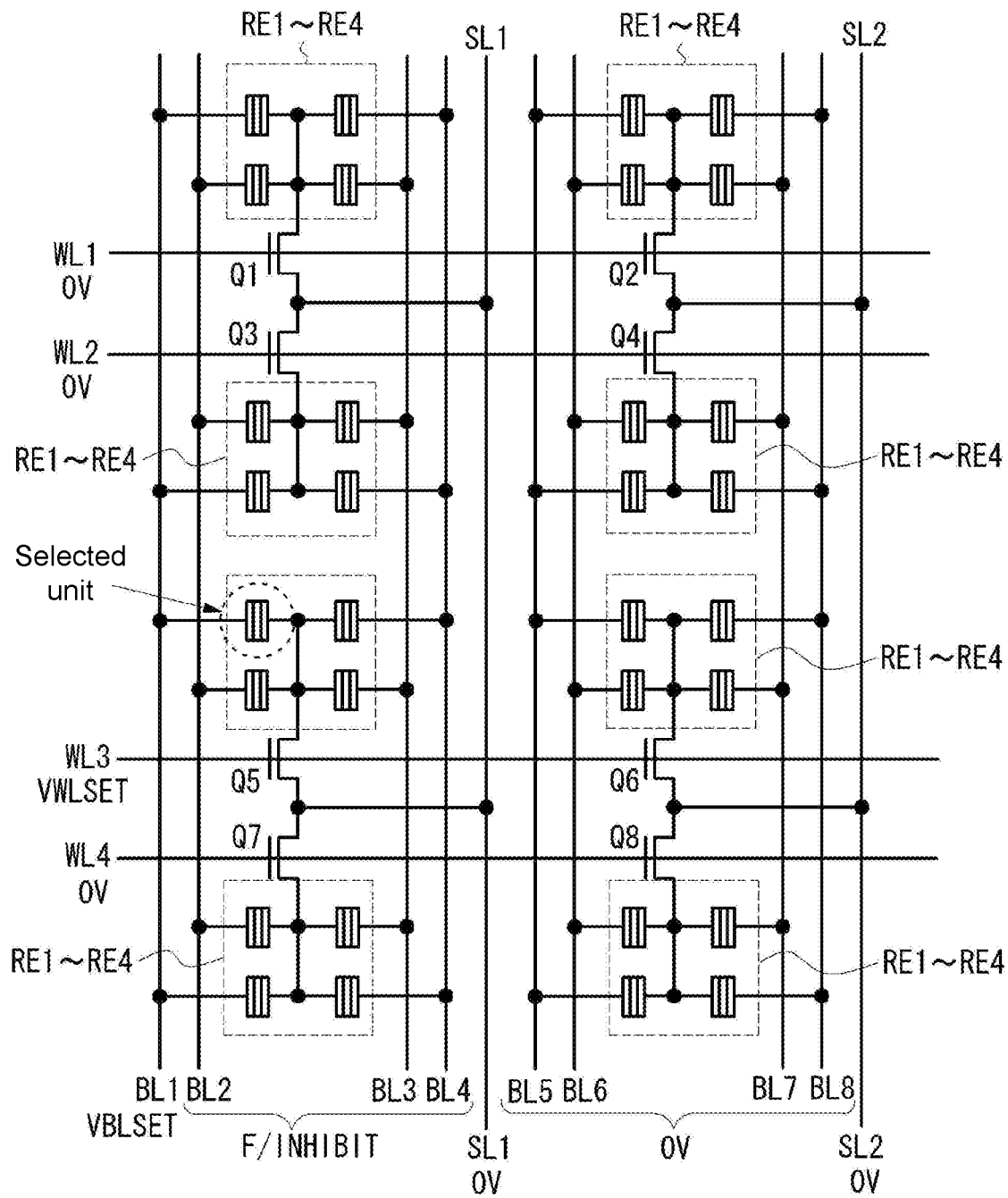
FIG. 12 is a diagram showing a bias voltage at the time of a SET write operation of the resistance variable memory according to the second embodiment of the disclosure.
Figure 13:
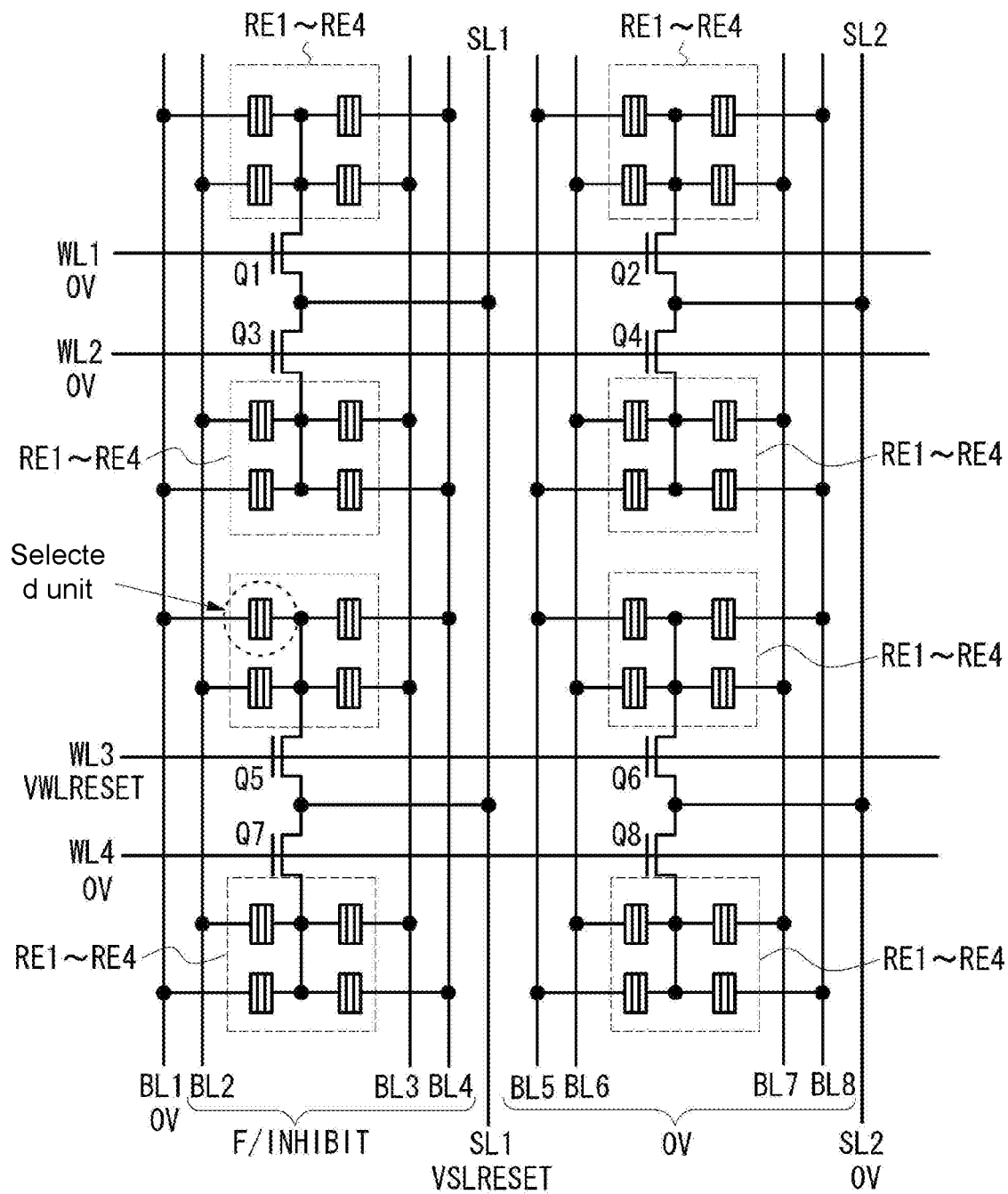
FIG. 13 is a diagram showing a bias voltage at the time of a RESET write operation of the resistance variable memory according to the second embodiment of the disclosure.

Next, the operation of the resistance variable memory according to the second embodiment of the disclosure will be described. FIG. 10 shows the bias voltage at the time of the read operation from the bit line side; FIG. 11 shows the bias voltage at the time of the read operation from the source line side; FIG. 12 shows the bias voltage at the time of the SET write operation; and FIG. 13 shows the bias voltage at the time of the RESET write operation. Further, in the second embodiment, the diode and the variable resistance element may be simultaneously integrated to more effectively suppress interference with the unselected variable resistance elements at the time of read and write.

Figure 14A:
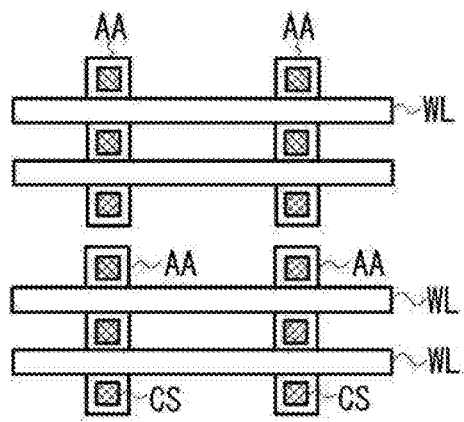
FIGS. 14A to 14J are diagrams for illustrating manufacturing steps of the resistance variable memory according to the first embodiment of the disclosure.

Next, manufacturing steps of the resistance variable memory according to the first embodiment of the disclosure will be described with reference to FIGS. 14A to 14J. FIG. 14A is a plan view showing the case where eight transistors are formed on the substrate. In the P-type well of the semiconductor substrate, n-type diffusion regions AA are formed, and the word lines WL including conductive polysilicon are formed in the row direction via a gate oxide film so as to be aligned therewith. An interlayer insulating film is formed on the entire substrate, and the contact holes CS for exposing the n-type diffusion regions AA are formed in the interlayer insulating film.

Figure 14B:
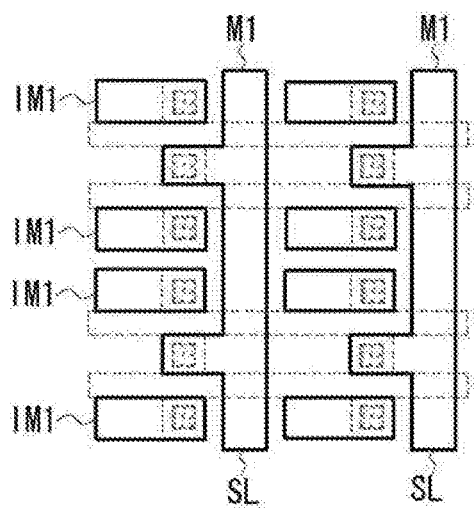

Next, as shown in FIG. 14B, a first-layer metal wiring M1 (indicated by a solid line in the figure) is formed on the interlayer insulating film. The first-layer metal wiring M1 includes: the source line SL that extends in the column direction and is electrically connected to the n-type diffusion regions (sources) between the two word lines via the contact holes CS, and the rectangular intermediate metal IM1 that is spaced apart from the source line SL in the row direction, extends in the row direction for a certain length and is electrically connected to the n-type diffusion regions (drains) on the outer side of the two word lines via the contact holes CS. The source line SL and the intermediate metal IM1 may be directly electrically connected to the n-type diffusion regions, or may be electrically connected to the n-type diffusion regions via a barrier metal or the like in the contact holes.

Figure 14C:
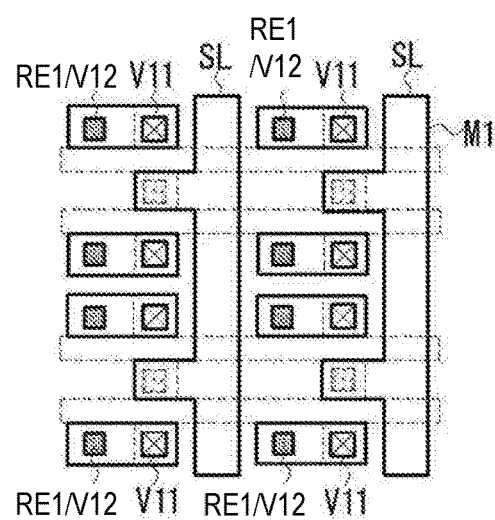

Next, as shown in FIG. 14C, an interlayer insulating film is formed on the entire substrate, and two via holes for exposing the intermediate metal IM1 are formed in the interlayer insulating film. A metal plug for electrically connecting to a second-layer metal wiring M2 is buried in one of the via holes to form a via hole V11. In one embodiment, the variable resistance element RE1 and a via hole V12 are buried in the other via hole. In the embodiment in which the diode and the variable resistance element RE1 are integrated at the same time, the variable resistance element RE1, the diode, and the via hole V12 are sequentially buried in the other via hole, wherein the diode may be formed, for example, by stacking a p-type polysilicon layer and an n-type polysilicon layer on the variable resistance element RE1.

Figure 14D:
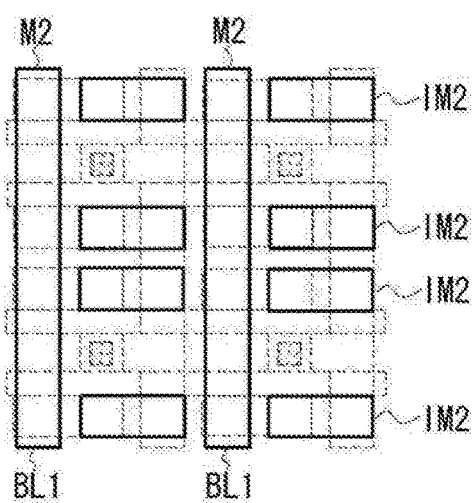

Next, as shown in FIG. 14D, the second-layer metal wiring M2 (indicated by a solid line in the figure) is formed. The second-layer metal wiring M2 includes the bit line BL1 extending in the column direction on the intermediate metal IM1, and the intermediate metal IM2 spaced apart from the bit line BL1 in the row direction and extending in the row direction for a certain length. The bit line BL1 is electrically connected to the variable resistance element RE1 via the via hole V12. The intermediate metal IM2 is electrically connected to the intermediate metal IM1 via the via hole V11, and has the same shape as the intermediate metal IM1, but is slightly shifted from the intermediate metal IM1 in the row direction.

Figure 14E:
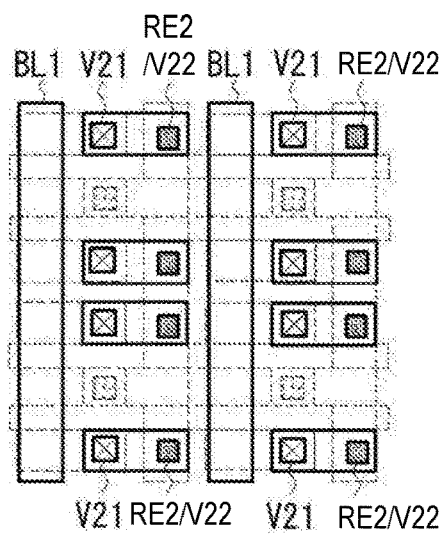

Next, as shown in FIG. 14E, an interlayer insulating film is formed on the entire substrate, and two via holes for exposing the intermediate metal IM2 are formed in the interlayer insulating film. A metal plug for electrically connecting to a third-layer metal wiring M3 is buried in one of the via holes to form a via hole V21. In one embodiment, the variable resistance element RE2 and a via hole V22 are buried in the other via hole. In the embodiment in which the diode and the variable resistance element RE2 are integrated at the same time, the variable resistance element RE2, the diode, and the via hole V22 are sequentially buried in the other via hole. In particular, the variable resistance element RE2 is, for example, disposed at a position (a position which is line-symmetric in the column direction) where the variable resistance element RE1 is reversed by 180 degrees in the row direction with the via hole V21 as the center.

Figure 14F:
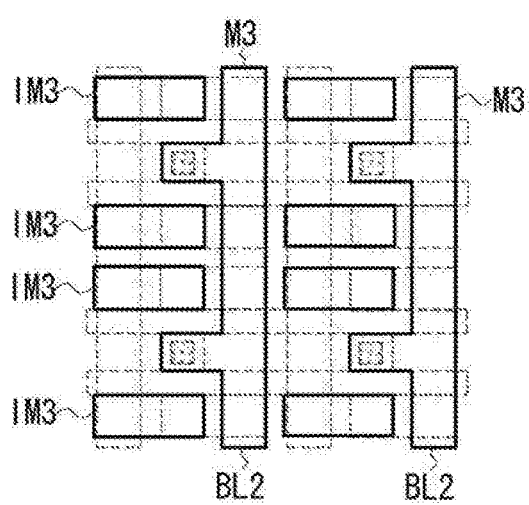
Figure 14G:
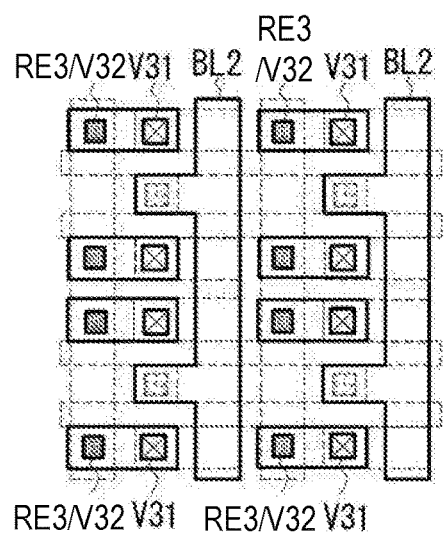

Next, as shown in FIG. 14F, the third-layer metal wiring M3 (indicated by a solid line in the figure) having the same wiring pattern as that of the first-layer metal wiring M1 is formed, and the metal wiring M3 forms the intermediate metal IM3 and the bit line BL2. The bit line BL2 is electrically connected to the variable resistance element RE2 via the via hole V22, and the intermediate metal IM3 is electrically connected to the intermediate metal IM2 via the via hole V21. Further, as shown in FIG. 14G, the variable resistance element RE3 and a via hole V32 are formed on the intermediate metal IM3, and a via hole V31 is formed.

Figure 14H:
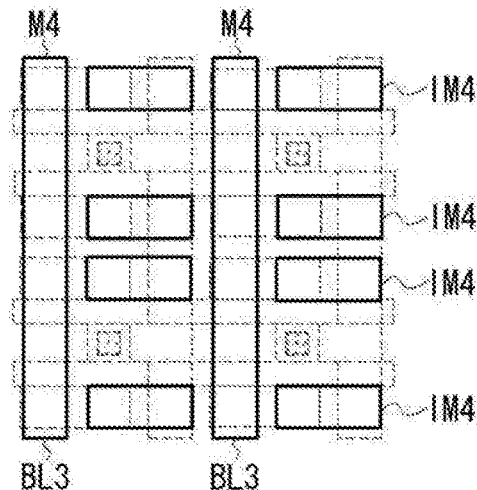
Figure 14I:
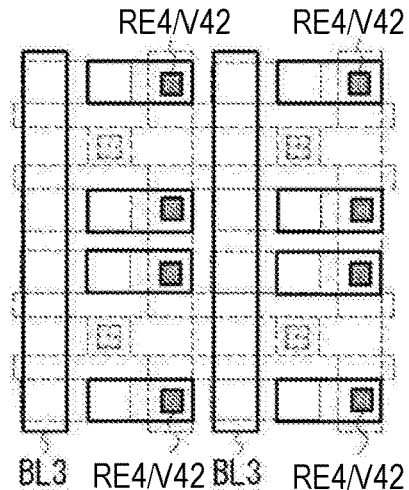

Next, as shown in FIG. 14H, a fourth-layer metal wiring M4 (indicated by a solid line in the figure) having the same wiring pattern as that of the second-layer metal wiring M2 is formed, and the metal wiring M4 forms the intermediate metal IM4 and the bit line BL3. The bit line BL3 is electrically connected to the variable resistance element RE3 via the via hole V32, and the intermediate metal IM4 is electrically connected to the intermediate metal IM3 via the via hole V31. Further, as shown in FIG. 14I, the variable resistance element RE4 and a via hole V42 are formed on the intermediate metal IM4.

Figure 14J:
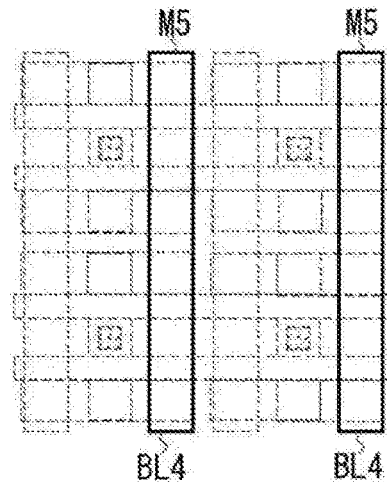

Next, as shown in FIG. 14J, a fifth-layer metal wiring M5 (indicated by a solid line in the figure) is formed. The metal wiring M5 forms the bit line BL4. The bit line BL4 is electrically connected to the variable resistance element RE4 via the via hole V42. As described above, the resistance variable memory of the first embodiment including eight transistors and 32 variable resistance elements is formed by five layers of multilayer metal wirings.

In the above embodiment, an example in which the variable resistance elements are formed in the via holes on the intermediate metals is shown, but the disclosure is not limited thereto. In other embodiments, the variable resistance elements may be formed on the intermediate metals by patterning first, and then the via holes electrically connected thereto may be formed on the variable resistance elements later. At this time, the size of the variable resistance element is not limited by the size of the via hole. Similarly, for the diode, the diode may also be formed by patterning first, and then a via hole electrically connected thereto may be formed on the diode later.

Figure 15A:
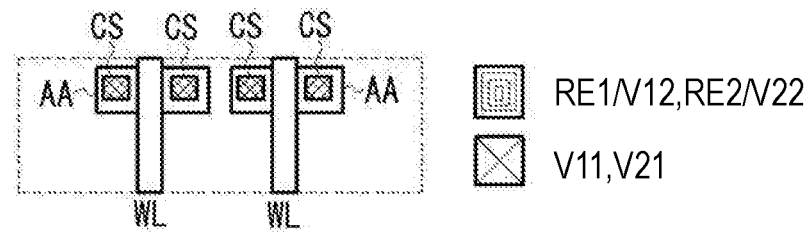
FIGS. 15A to 15G are diagrams for illustrating manufacturing steps of the resistance variable memory according to the second embodiment of the disclosure.

FIGS. 15A to 15G show manufacturing steps of the resistance variable memory according to the second embodiment of the disclosure. FIG. 15A is a plan view showing the case where two transistors are formed. In the P-type well W of the semiconductor substrate, the n-type diffusion regions AA are formed, and the word lines WL including conductive polysilicon are formed in the column direction via a gate oxide film so as to be aligned therewith. Then, an interlayer insulating film is formed on the entire substrate, and the contact holes CS for exposing the n-type diffusion regions AA are formed in the interlayer insulating film.

Figure 15B:
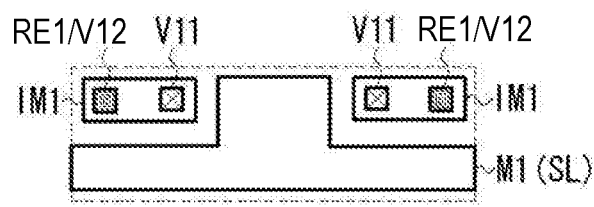

FIG. 15B is a plan view of the first-layer metal wiring M1. The first-layer metal wiring M1 includes the source line SL extending in the row direction and having a protruding portion protruding in the column direction, and the rectangular intermediate metal IM1 spaced apart from the source line SL in the column direction and extending in the row direction for a certain length. The protruding portion of the source line SL is electrically connected to the two n-type diffusion regions (sources) between two adjacent word lines via the contact holes CS, and the intermediate metal IM1 is electrically connected to the n-type diffusion regions (drains) on the outer side of two adjacent word lines via the contact hole CS. Further, the variable resistance element RE1, the via hole V12, and the via hole V11 are formed on the intermediate metal IM1.

Figure 15C:
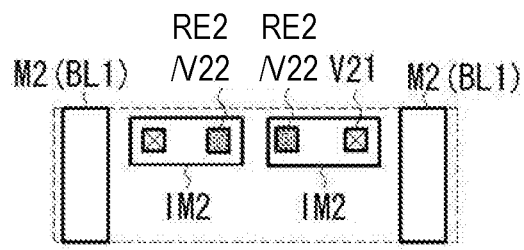

FIG. 15C is a plan view of the second-layer metal wiring M2. The second-layer metal wiring M2 includes the bit line BL1 extending in the column direction, and the intermediate metal IM2 spaced apart from the bit line BL1 in the row direction and extending in the row direction for a certain length. The bit line BL1 is electrically connected to the variable resistance element RE1 via the via hole V12. The intermediate metal IM2 is electrically connected to the intermediate metal IM1 via the via hole V11, and has the same shape as the intermediate metal IM1, but is slightly shifted from the intermediate metal IM1 in the row direction. Further, the variable resistance element RE2, the via hole V22, and the via hole V21 are formed on the intermediate metal IM2.

Figure 15D:
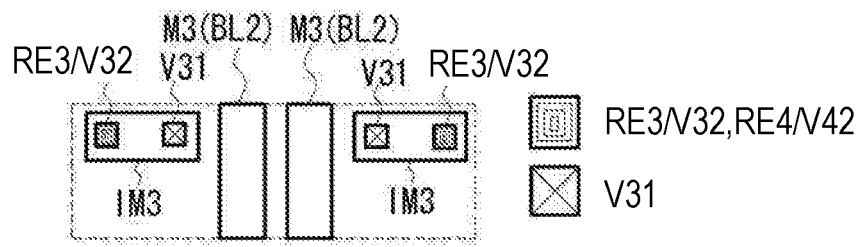

FIG. 15D is a plan view of the third-layer metal wiring M3. The third-layer metal wiring M3 includes the bit line BL2 extending in the column direction, and the intermediate metal IM3 spaced apart from the bit line BL2 in the row direction and extending in the row direction for a certain length. The bit line BL2 is electrically connected to the variable resistance element RE2 via the via hole V22. The intermediate metal IM3 is electrically connected to the intermediate metal IM2 via the via hole V21. Further, the variable resistance element RE3, the via hole V32, and the via hole V31 are formed on the intermediate metal IM3. The intermediate metal IM3, the variable resistance element RE3, the via hole V32, and the via hole V31 are disposed at positions substantially coinciding with the positions at which the intermediate metal IM1, the variable resistance element RE1, the via hole V12, and the via hole V11 are disposed.

Figure 15E:
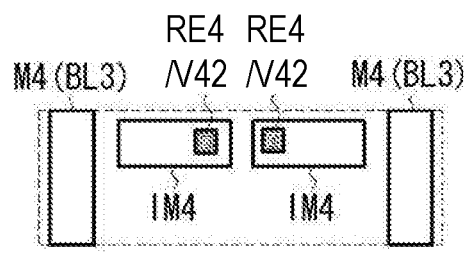

FIG. 15E is a plan view of the fourth-layer metal wiring M4. The fourth-layer metal wiring M4 has the same pattern as that of the second-layer metal wiring M2, and includes the bit line BL3 and the intermediate metal IM4. The bit line BL3 is electrically connected to the variable resistance element RE3 via the via hole V32. Further, the variable resistance element RE4 and the via hole V42 are formed on the intermediate metal IM4.

Figure 15F:
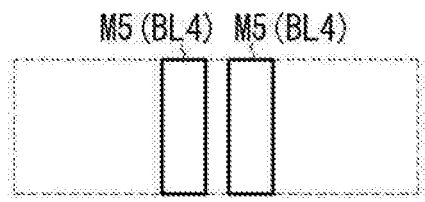

FIG. 15F is a plan view of the fifth-layer metal wiring M5. The fifth-layer metal wiring M5 forms the bit line BL4, and is electrically connected to the variable resistance element RE4 via the via hole V42. As described above, the resistance variable memory of the second embodiment including two transistors and eight variable resistance elements is formed by five layers of multilayer metal wirings.

Figure 15G:
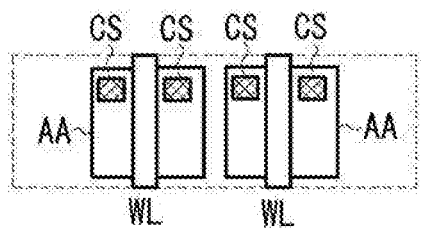

In some embodiments, it is desirable to minimize the gate width of the transistor on the basis of having achieved high integration of the memory array, but on the other hand, for performing write to the variable resistance element, it is necessary to apply a certain current to the variable resistance element. Therefore, it is also possible to increase the gate width of the transistor as in the example of FIG. 15G, compared with the minimum gate width that can be manufactured using design rules. In other words, since the size of the memory cell is limited by the wiring, a more suitable value is set to the gate width for accessing the transistor.

The preferred embodiments of the disclosure have been described in detail above, but the disclosure is not limited thereto, and various modifications and changes may be made by persons skilled in the art without departing from the scope of the disclosure defined by the attached claims.

What is claimed is:

1. A resistance variable memory for storing data in a reversible and non-volatile variable resistance element, the resistance variable memory comprising:
   a plurality of transistors formed on a surface of a substrate; and
   a plurality of variable resistance elements stacked on the surface of the substrate in a vertical direction, one electrode of each of the plurality of variable resistance elements being commonly electrically connected to one electrode of one transistor,
   wherein another electrode of each of the plurality of variable resistance elements is electrically connected to a bit line, another electrode of each of the plurality of transistors is electrically connected to a source line, and each gate of transistors in a row direction is commonly connected to a word line,
   wherein the plurality of variable resistance elements corresponding to the same transistor are deposited in different interlayer insulating film layers, wherein a first variable resistance element among the plurality of variable resistance elements is formed between a first bit line and a first intermediate metal, wherein a second variable resistance element among the plurality of variable resistance elements is formed between a second bit line and a second intermediate metal, wherein the second intermediate metal and the first bit line are formed as one metal wiring layer.

2. The resistance variable memory according to claim 1, wherein each of the plurality of variable resistance elements is connected to a corresponding diode.

3. The resistance variable memory according to claim 2, wherein the diode flows a forward current when a forward bias voltage is applied, and flows a reverse current when a reverse bias voltage is applied.

4. The resistance variable memory according to claim 1, wherein the plurality of variable resistance elements are respectively formed on wirings of respective layers of a multilayer wiring structure.

5. The resistance variable memory according to claim 1, wherein the plurality of variable resistance elements are formed at positions different from one another in respective layers.

6. The resistance variable memory according to claim 2, wherein the variable resistance element and the diode are stacked in a via hole contact.

7. The resistance variable memory according to claim 1, wherein the variable resistance element comprises a transition metal oxide.

8. The resistance variable memory according to claim 1, wherein the bit lines and the source lines are parallel on a memory array.

9. The resistance variable memory according to claim 1, wherein the bit lines and the source lines are orthogonal on a memory array.

10. The resistance variable memory according to claim 1, wherein during a read operation, a selected variable resistance element of the plurality of variable resistance elements is selected, a selected transistor connected to the selected variable resistance of the plurality of transistors is selected, wherein a bit line connected to the selected variable resistance element is applied a first read voltage, wherein a bit line connected to an unselected variable resistance element connected to the selected transistor is applied an inhibit voltage.

11. The resistance variable memory according to claim 10, wherein during the read operation, the inhibit voltage is an intermediate voltage lower than the first read voltage and higher than 0 V.

12. The resistance variable memory according to claim 10, wherein during the read operation, the selected transistor is turned on by a second read voltage, wherein a source line connected to a source of the selected transistor is applied a voltage of 0 V.

13. The resistance variable memory according to claim 10, wherein during the read operation, a plurality of bit lines connected to the plurality of variable resistance elements connected to the unselected transistor are floated or are applied a voltage of 0 V.

14. The resistance variable memory according to claim 1, wherein during a read operation, a selected variable resistance element of the plurality of variable resistance elements is selected, a selected transistor connected to the selected variable resistance of the plurality of transistors is selected, wherein a bit line connected to the selected variable resistance element is applied a voltage of 0 V, wherein a bit line connected to an unselected variable resistance element connected to the selected transistor is applied an inhibit voltage.

15. The resistance variable memory according to claim 14, wherein during the read operation, the selected transistor is turned on by a first read voltage, wherein a source line connected to a source of the selected transistor is applied a second read voltage.

16. The resistance variable memory according to claim 1, wherein during a set write operation, a selected variable resistance element of the plurality of variable resistance elements is selected, a selected transistor connected to the selected variable resistance of the plurality of transistors is selected, wherein a bit line connected to the selected variable resistance element is applied a first write voltage, wherein a bit line connected to an unselected variable resistance element connected to the selected transistor is floated or are applied an inhibit voltage.

17. The resistance variable memory according to claim 16, wherein during the set write operation, the selected transistor is turned on by a second write voltage, wherein a source line connected to a source of the selected transistor is applied a voltage of 0 V.

18. The resistance variable memory according to claim 16, wherein during the set write operation, a plurality of bit lines connected to the plurality of variable resistance elements connected to the unselected transistor are floated or are applied a voltage of 0 V.

19. The resistance variable memory according to claim 1, wherein during a reset write operation, a selected variable resistance element of the plurality of variable resistance elements is selected, a selected transistor connected to the selected variable resistance of the plurality of transistors is selected, and wherein a bit line connected to the selected variable resistance element is applied a voltage of 0 V, wherein a bit line connected to an unselected variable resistance element connected to the selected transistor is floated or are applied an inhibit voltage.

20. The resistance variable memory according to claim 19, wherein during the reset write operation, the selected transistor is turned on by a first write voltage, wherein a source line connected to a source of the selected transistor is applied a second write voltage, wherein the inhibit voltage is an intermediate voltage lower than the second write voltage and higher than 0 V.

* * * * *

UNITED STATES PATENT AND TRADEMARK OFFICE
CERTIFICATE OF CORRECTION

| | |
|---|---|
| PATENT NO. | : 11,222,923 B2 |
| APPLICATION NO. | : 16/666421 |
| DATED | : January 11, 2022 |
| INVENTOR(S) | : Tomita |

Page 1 of 1

It is certified that error appears in the above-identified patent and that said Letters Patent is hereby corrected as shown below:

On the Title Page

Item (30) should read:
(30) Foreign Application Priority Data
January 16, 2019 (JP) ................2019-005316

Signed and Sealed this
Twelfth Day of April, 2022

Drew Hirshfeld
*Performing the Functions and Duties of the
Under Secretary of Commerce for Intellectual Property and
Director of the United States Patent and Trademark Office*